(12) United States Patent
Mead

(10) Patent No.: US 8,074,146 B2
(45) Date of Patent: Dec. 6, 2011

(54) MULTIPLE CYCLIC REDUNDANCY CHECK (CRC) ENGINES FOR CHECKING/APPENDING CRCS DURING DATA TRANSFERS

(75) Inventor: John P. Mead, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 1000 days.

(21) Appl. No.: 11/972,670

(22) Filed: Jan. 11, 2008

(65) Prior Publication Data
US 2009/0089644 A1 Apr. 2, 2009

Related U.S. Application Data

(60) Provisional application No. 60/976,158, filed on Sep. 28, 2007.

(51) Int. Cl.
*H03M 13/00* (2006.01)
(52) U.S. Cl. .......................... 714/758; 714/753; 714/755
(58) Field of Classification Search ............... 714/758, 714/755, 753, 757
See application file for complete search history.

(56) References Cited

U.S. PATENT DOCUMENTS

| | | | | |
|---|---|---|---|---|
| 4,809,273 A * | 2/1989 | Jackowski et al. | ............ | 714/703 |
| 6,467,060 B1 * | 10/2002 | Malakapalli et al. | ......... | 714/758 |
| 6,519,733 B1 * | 2/2003 | Har et al. | ...................... | 714/758 |
| 6,820,228 B1 * | 11/2004 | Keller | .............................. | 714/757 |
| 7,020,809 B2 * | 3/2006 | Kleppel et al. | ................... | 714/52 |
| 7,363,573 B1 * | 4/2008 | Bataineh | ....................... | 714/758 |
| 7,543,214 B2 * | 6/2009 | Ricci | .............................. | 714/758 |
| 2009/0282148 A1 * | 11/2009 | Wong et al. | ................... | 709/226 |
| 2009/0282322 A1 * | 11/2009 | Wong et al. | ................... | 714/807 |

\* cited by examiner

*Primary Examiner* — John J Tabone, Jr.
(74) *Attorney, Agent, or Firm* — Garlick Harrison & Markison; Shayne X. Short

(57) ABSTRACT

Multiple cyclic redundancy check (CRC) engines for checking/appending CRCs during data transfers. Two distinctly implemented CRC engines are employed to enable the processing of different sized byte formats at two ends of a communication channel. These two distinctly implemented CRC engines can be employed to enable the processing of different sized byte formats in a host device at one end and an hard disk drive (HDD) at another end. For example, sometimes the size of blocks, frames, and/or sector sizes that are processed and employed within a first communication device at one end of a communication channel can differ from the size of blocks, frames, and/or sector sizes that are processed and employed within a second communication device at another end of the communication channel. Two distinctly implemented CRC engines allow the appropriate processing and translation of any desired different sized blocks, frames, and/or sector sizes of a communication channel.

20 Claims, 13 Drawing Sheets

US 8,074,146 B2

MULTIPLE CYCLIC REDUNDANCY CHECK (CRC) ENGINES FOR CHECKING/APPENDING CRCS DURING DATA TRANSFERS

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 60/976,158, entitled "Multiple cyclic redundancy check (CRC) engines for checking/appending CRCs during data transfers," filed Sep. 28, 2007, pending.

BACKGROUND OF THE INVENTION

1. Technical Field of the Invention

The invention relates generally to encoding and/or decoding of signals within and/or between various devices; and, more particularly, it relates to employing cyclic redundancy checks (CRCs) in accordance with such encoding and decoding.

2. Description of Related Art

Data communication systems have been under continual development for many years. One such type of communication system that has been of significant interest lately is a communication system that employs iterative error correction codes. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

As is known, many varieties of memory storage devices (e.g. hard disk drives (HDDs)), such as magnetic disk drives are used to provide data storage for a host device, either directly, or through a network such as a storage area network (SAN) or network attached storage (NAS). Such a memory storage system (e.g., a HDD) can itself be viewed as a communication system in which information is encoded and provided via a communication channel to a storage media; the reverse direction of communication is also performed in a HDD in which data is read from the media and passed through the communication channel (e.g., sometimes referred to as a read channel in the HDD context) at which point it is decoded to makes estimates of the information that is read.

Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

Some communication systems, including HDDs, employ error detecting and/or correcting codes to deal with errors that may be incurred within signals that are transmitted within a communication system. In the HDD context, such undesirable errors can be incurred during the write and/or read processes to and from the storage media of the HDD. In some applications, the size of blocks, frames, and/or sector sizes that are processed and employed within a first communication device at one end of a communication channel can differ from the size of blocks, frames, and/or sector sizes that are processed and employed within a second communication device at another end of the communication channel. In the HDD context, sometimes the size of blocks, frames, and/or sector sizes that are processed and employed within a host device at one end of the read channel can differ from the size of blocks, frames, and/or sector sizes that are processed and employed within the actual HDD system (including the size of blocks, frames, and/or sector sizes that are stored on the storage media of the HDD).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel means is presented herein in which a CRC checking and report system is used to verify the transfer between two separate locations (e.g., a main buffer of a hard disk drive (HDD) controller and the read/write datapath of the read channel).

Generally speaking, sometimes cc related errors correspond to firmware errors. Another source of CRC errors is alpha (α) particle contamination that may be existent or occur when data is written to disk. For example, as memory technologies get smaller and smaller, sometimes the memories can have state transitions for unforeseen reasons. For example, unforeseen radiation (e.g., gamma rays) can sometimes cause a bit to flip in one or more memory locations within the storage media of a HDD. Generally speaking, CRC errors are too extremely prevalent, but it is nevertheless necessary to perform proper detection and processing of CRC related errors for accurate reproduction of data from storage media of a HDD.

The processing capability presented herein allows for translation and processing of different sized blocks, frames, and/or sector sizes that are processed and employed within a first communication device at one end of a communication channel can differ from the size of blocks, frames, and/or sector sizes that are processed and employed within a second communication device at another end of the communication channel. To effectuate this processing and translation, the CRC system depicted herein uses two independent CRC generators (engines). This capability presented herein can be applied to a broad range of applications including within communication devices that include a HDD.

Using two separate CRC engines is beneficial compared to using only one. With a single CRC engine, it is difficult at best to support different sized blocks, frames, and/or sector sizes between two ends of a communication channel (e.g., between the host and the disk in a HDD application). Also, with using only a single CRC engine in a HDD context, supporting dissimilar different sized blocks, frames, and/or sector sizes may result in format inefficiencies due to writing multiple host CRCs to the disk.

In the HDD context, by decoupling a disk CRC from a host CRC at the disk interface, this can help facilitate the flexibility to support dissimilar sector sizes between disk and host interfaces. Also, this can be implemented to support dissimilar sector sized blocks, frames, and/or sectors between host and disk without resulting in format inefficiencies due to writing multiple host CRCs to the disk.

As also described below within other embodiments, it is also noted that the size of each of a first CRC engine and a second CRC engine can be different (e.g., 16 bit for the first CRC engine and 32 bit for the second CRC engine). Also, it is noted that each of the first CRC engine and the second CRC engine can employ different linear feedback shift registers (LFSRs) or primitive polynomials to define the pattern employed.

Figure 1:
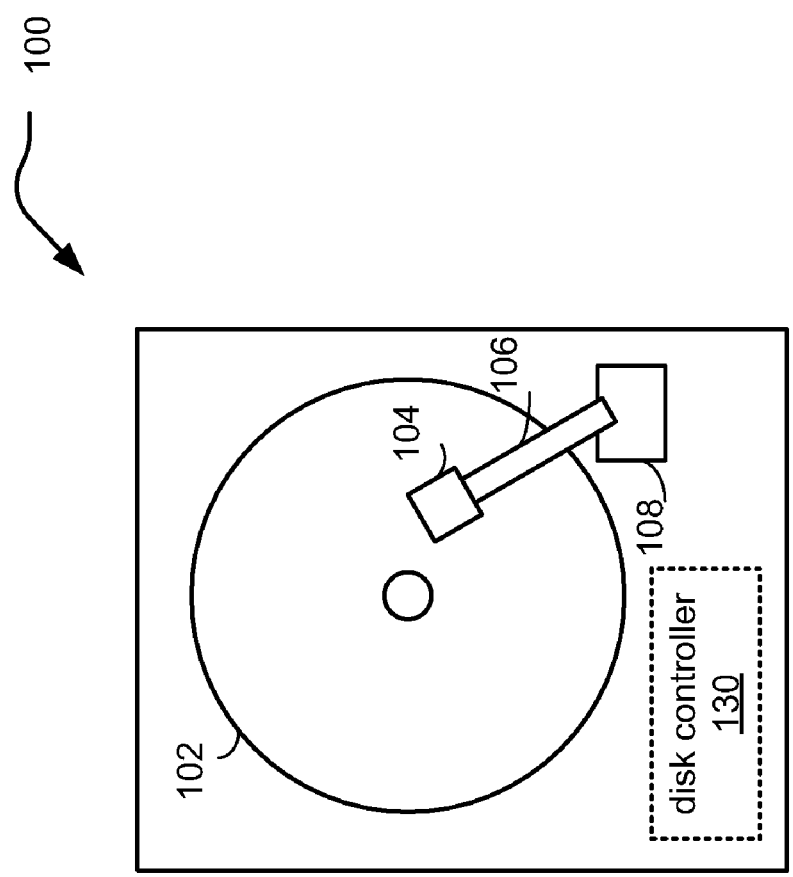
FIG. 1 illustrates an embodiment of a disk drive unit.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
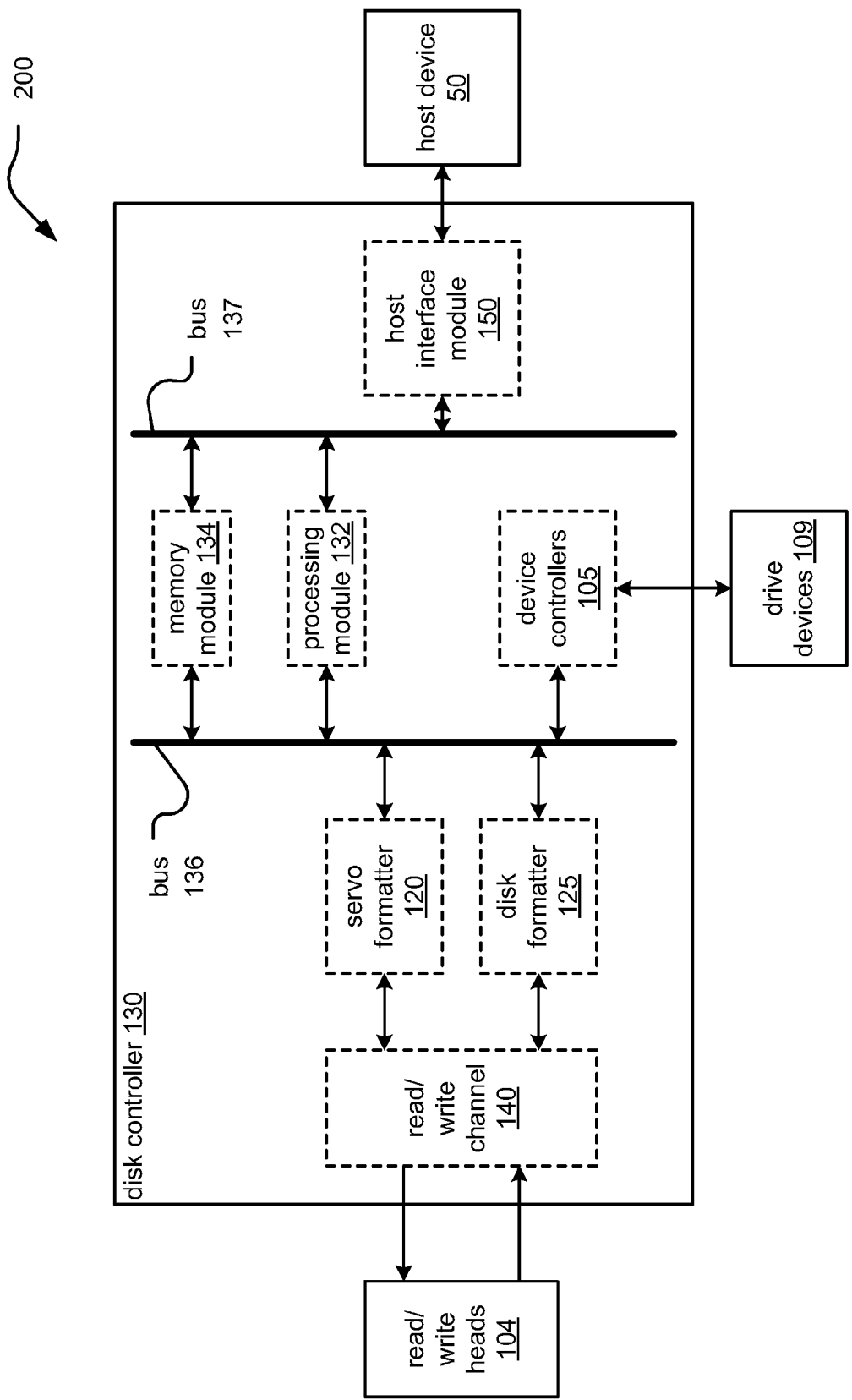
FIG. 2 illustrates an embodiment of an apparatus that includes a disk controller.

FIG. 2 illustrates an embodiment of an apparatus 200 that includes a disk controller 130. In particular, disk controller 130 includes a read/write channel 140 for reading and writing data to and from disk 102 through read/write heads 104. Disk formatter 125 is included for controlling the formatting of data and provides clock signals and other timing signals that control the flow of the data written to, and data read from disk 102. Servo formatter 120 provides clock signals and other timing signals based on servo control data read from disk 102. Device controllers 105 control the operation of drive devices 109 such as actuator 108 and the servo motor, etc. Host interface 150 receives read and write commands from host device 50 and transmits data read from disk 102 along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 130 further includes a processing module 132 and memory module 134. Processing module 132 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing module 132, memory module 134, read/write channel 140, disk formatter 125, and servo formatter 120 that are interconnected via bus 136 and bus 137. The host interface 150 can be connected to only the bus 137 and communicates with the host device 50. Each of these modules can be implemented in hardware, firmware, software or a combination thereof, in accordance with the broad scope of the present invention. While a particular bus architecture is shown in FIG. 2 with buses 136 and 137, alternative bus architectures that include either a single bus configuration or additional data buses, further connectivity, such as direct connectivity between the various modules, are likewise possible to implement the features and functions included in various embodiments.

In one possible embodiment, one or more modules of disk controller 130 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 105 and optionally additional modules, such as a power supply, etc. In a further embodiment, the various functions and features of disk controller 130 are implemented in a plurality of integrated circuit devices that communicate and combine to perform the functionality of disk controller 130.

When the drive unit 100 is manufactured, disk formatter 125 writes a plurality of servo wedges along with a corresponding plurality of servo address marks at equal radial distance along the disk 102. The servo address marks are used by the timing generator for triggering the "start time" for various events employed when accessing the media of the disk 102 through read/write heads 104.

Figure 3:
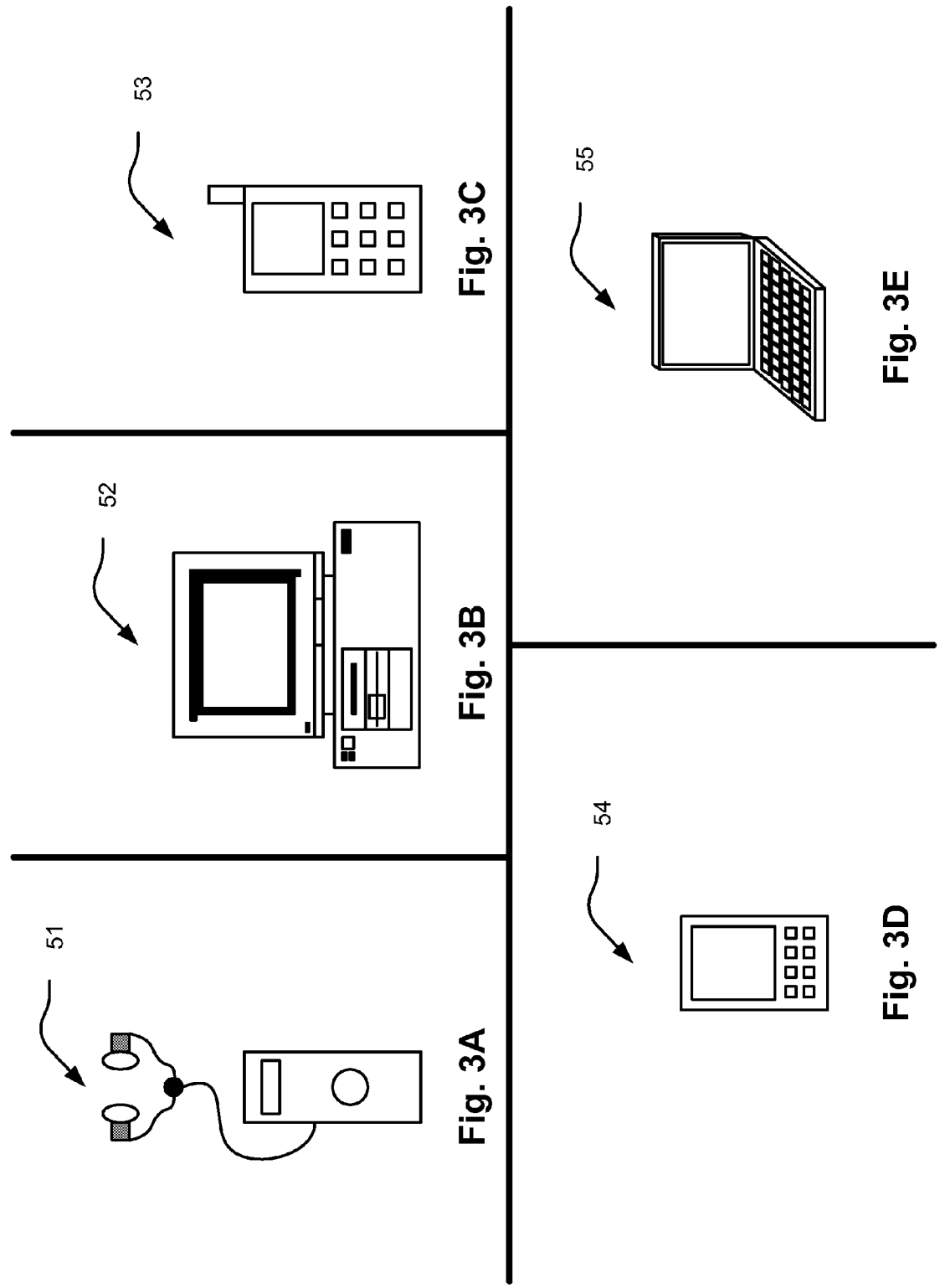
FIG. 3A illustrates an embodiment of a handheld audio unit.
FIG. 3B illustrates an embodiment of a computer.
FIG. 3C illustrates an embodiment of a wireless communication device.
FIG. 3D illustrates an embodiment of a personal digital assistant (PDA).
FIG. 3E illustrates an embodiment of a laptop computer.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3(MP3) files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3(MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3(MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk whose disk 102 has a diameter 1.8" or smaller, or a 2.5" drive. Disk drive 100 is incorporated into or otherwise used by laptop computer 52 to provide general purpose storage for any type of information in digital format.

Figure 4:
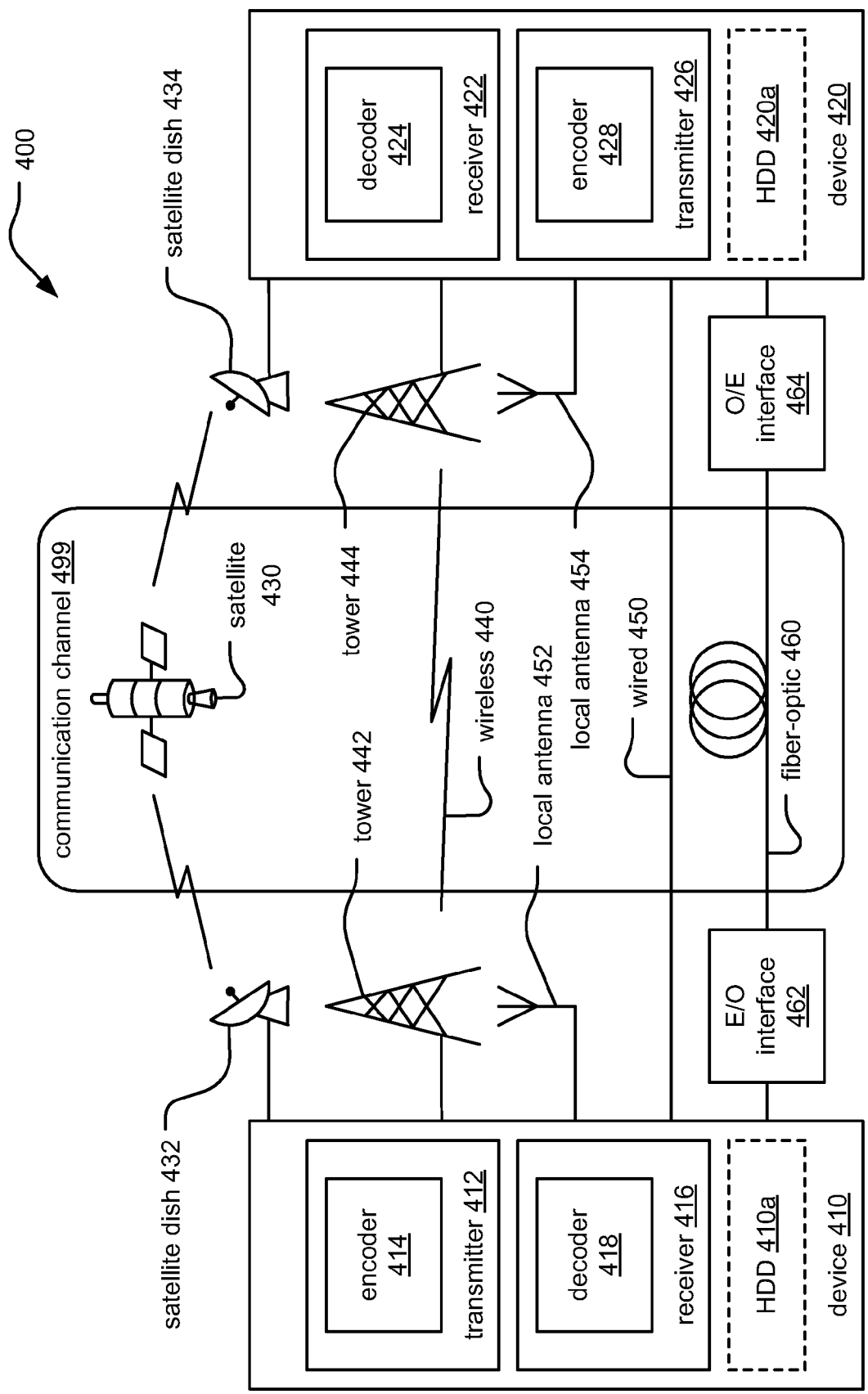
FIG. 4 illustrates an embodiment of a communication system.

FIG. 4 is a diagram illustrating an embodiment of a communication system 400.

Referring to FIG. 4, this embodiment of a communication system 400 is a communication channel 499 that communicatively couples a communication device 410 (including a transmitter 412 having an encoder 414 and including a receiver 416 having a decoder 418) situated at one end of the communication channel 499 to another communication device 420 (including a transmitter 426 having an encoder 428 and including a receiver 422 having a decoder 424) at the other end of the communication channel 499. In some embodiments, either of the communication devices 410 and 420 may only include a transmitter or a receiver. There are several different types of media by which the communication channel 499 may be implemented (e.g., a satellite communication channel 430 using satellite dishes 432 and 434, a wireless communication channel 440 using towers 442 and 444 and/or local antennae 452 and 454, a wired communication channel 450, and/or a fiber-optic communication channel 460 using electrical to optical (E/O) interface 462 and optical to electrical (O/E) interface 464)). In addition, more than one type of media may be implemented and interfaced together thereby forming the communication channel 499.

Either one of both of the communication device 410 and the communication device 420 can include a hard disk drive (HDD) (or be coupled to a HDD). For example, the communication device 410 can include a HDD 410*a*, and the communication device 420 can include a HDD 420*a*.

The signals employed within this embodiment of a communication system 400 can be Reed-Solomon (RS) coded signals, LDPC (Low Density Parity Check) coded signal, turbo coded signals, turbo trellis coded modulation (TTCM), or coded signal generated using some other error correction code (ECC).

In addition, these signals can undergo processing to generate a cyclic redundancy check (CRC) and append it (or attach it) to data between transferred between the communication device 410 and the communication device 420 9or vice versa) or to data being transferred to and from the HDD 410*a* within the communication device 410 or to and from the HDD 420*a* within the communication device 420.

Any of a very wide variety of applications that perform transferring of data from one location to another (e.g., including from a first location to a HDD, or from the HDD to another location) can benefit from various aspects of the invention, including any of those types of communication devices and/or communication systems depicted in FIG. 4. Moreover, other types of devices and applications that employ CRCs (e.g., including those employing some type of HDD or other memory storage means) can also benefit from various aspects of the invention.

Figure 5:
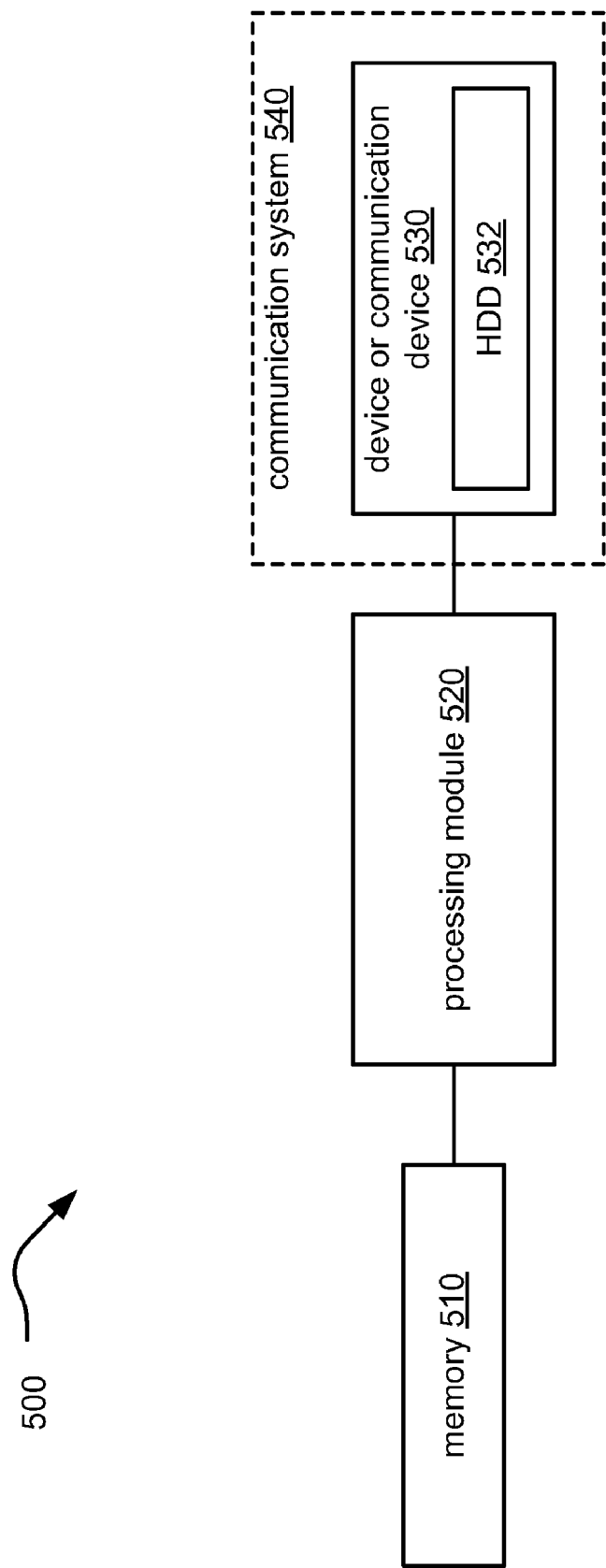
FIG. 5 illustrates an embodiment of an apparatus that is operable to employ one or more cyclic redundancy checks (CRCs) in accordance with encoding and decoding of signals within and between various communication devices.

FIG. 5 illustrates an embodiment of an apparatus 500 that is operable to employ one or more cyclic redundancy checks (CRCs) in accordance with encoding and decoding of signals within and between various communication devices. The apparatus 500 includes a processing module 520, and a memory 510. The memory 510 is coupled to the processing module, and the memory 510 is operable to store operational instructions that enable the processing module 520 to perform a variety of functions. The processing module 520 is operable to perform the appropriate generating and/or processing of one or more CRCs using any of the approaches presented herein.

The processing module 520 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 510 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 520 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the means of generating and/or processing of one or more CRCs can be provided from the apparatus 500 to a communication system 540 that is operable to employ and perform signal processing in accordance with such CRCs. The means of generating and/or processing of one or more CRCs can also be provided from the apparatus 500 to any of a variety of devices or communication devices 530 implemented within the communication system 540 as well. The device or communication device 530 can include a HDD 532 in certain embodiments. This way, a completely integrated means is provided by which the means of generating and/or processing of one or more CRCs implemented as part of a device or communication device that employs such CRCs.

If desired, the apparatus 520 can be designed to generate multiple means of generating and/or processing of one or more CRCs corresponding to multiple needs and/or desires as well. In some embodiments, the apparatus 520 can selectively provide different information (corresponding to different means of CRC processing) to different communication devices and/or communication systems. That way, different communication links between different communication devices can employ different CRCs. Clearly, the apparatus 520 can also provide the same information (corresponding to a singular the means of generating and/or processing of one or more CRCs) to each of different communication devices and/or communication systems as well without departing from the scope and spirit of the invention.

Figure 6:
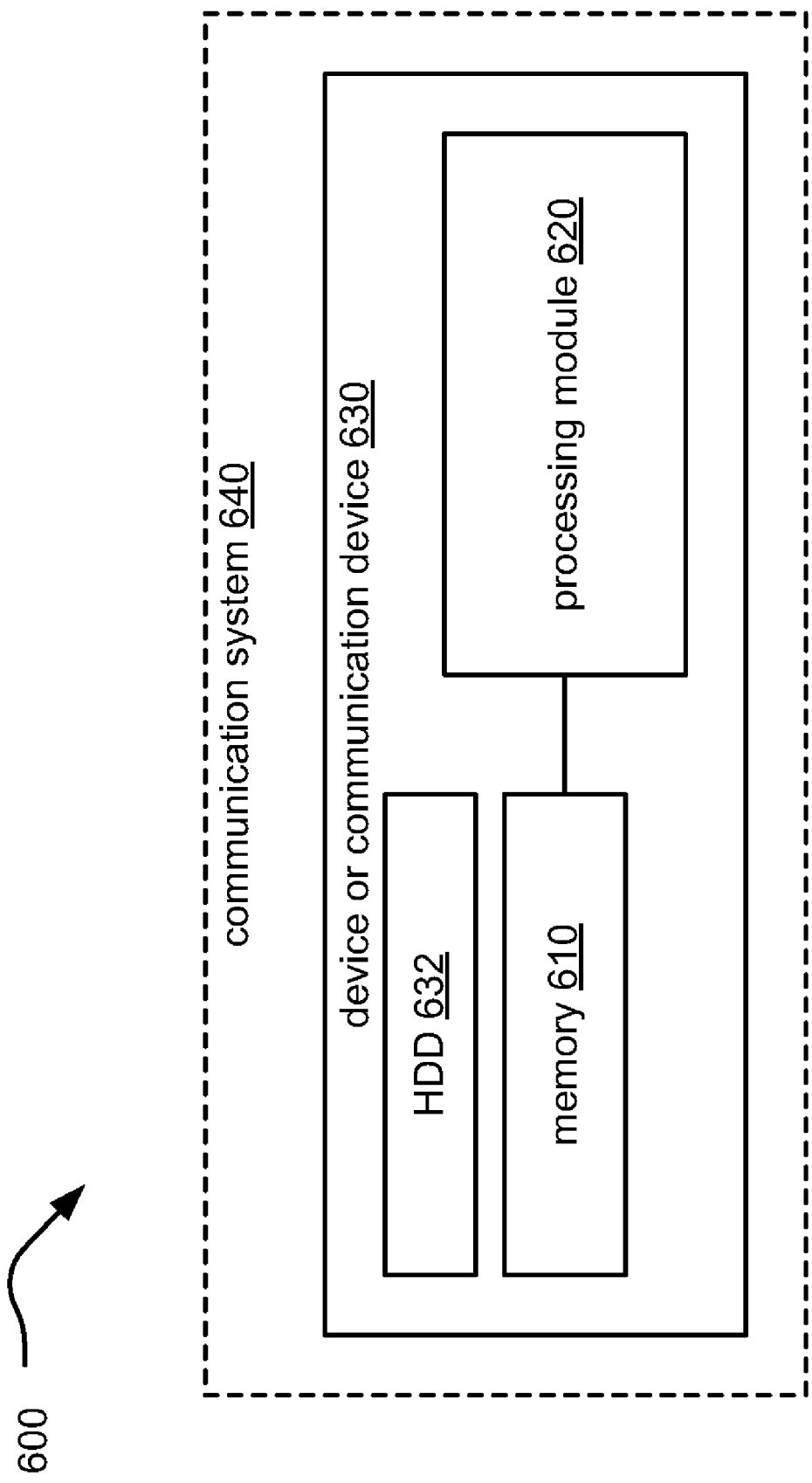
FIG. 6 illustrates an alternative embodiment of an apparatus that is operable to employ one or more CRCs in accordance with encoding and decoding of signals within and between various communication devices.

FIG. 6 illustrates an alternative embodiment of an apparatus 600 that is operable to employ one or more CRCs in accordance with encoding and decoding of signals within and between various communication devices. The apparatus 600 includes a processing module 620, and a memory 610. The memory 610 is coupled to the processing module, and the memory 610 is operable to store operational instructions that enable the processing module 620 to perform a variety of functions. The processing module 620 (serviced by the memory 610) can be implemented as an apparatus capable to perform any of the functionality of any of the various modules and/or functional blocks described herein. For example, the processing module 620 (serviced by the memory 620) can be implemented as an apparatus capable to perform generating and/or processing of one or more CRCs using any of the various embodiments described herein.

The processing module 620 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 610 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 620 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 600 can be any of a variety of devices, or any part or portion of any such device or communication device. The device or communication device 630 can include a HDD 632 in certain embodiments. Any such communication device that includes the apparatus 600 can be implemented within any of a variety of communication systems 640 as well. It is also noted that various embodiments of means of generating and/or processing of one or more CRCs presented herein, and equivalents thereof, may be applied to many types of communication systems and/or communication devices.

Figure 7:
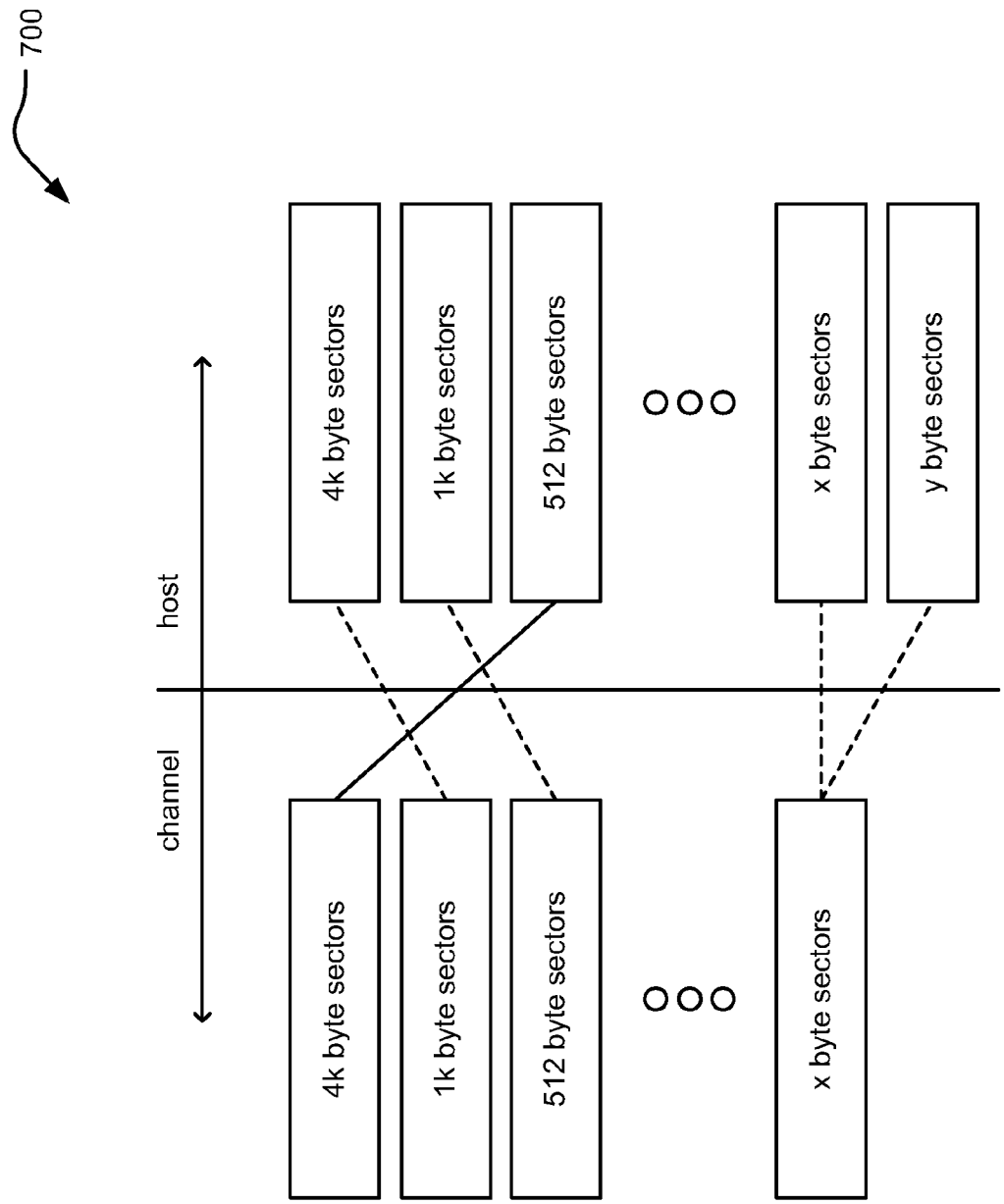
FIG. 7 illustrates an embodiment of different sector sizes being employed on a channel side and a host side within a system including a HDD.

FIG. 7 illustrates an embodiment 700 of different sector sizes being employed on a channel side and a host side within a system including a HDD. Within some applications, different sized sectors (or blocks, or frames, etc.) are employed within modules located at different locations within a communication system. For example, in a HDD context, sometimes the host employed sectors having a different size than the sector size used to store information on the media of the HDD.

For example, considering the two sides of channel and host within a HDD application, the channel side can employ sectors having sizes of 4 k byte, 1 k byte, 512 byte, or some other size (depicted generally as x byte sectors). Analogously, the host side can employ sectors having sizes of 4 k byte, 1 k byte, 512 byte, or some other size (depicted $1^{st}$ generally as x byte sectors, which is the same as x byte sectors on the channel side, or depicted $2^{nd}$ generally as y byte sectors, which is the different than the x byte sectors on the channel side).

Herein, a means is presented by which translation can be performed between modules that employ sectors (or blocks, or frames, etc.) having at least two different sizes. It is also noted that the means presented herein can also be applied to modules that employ sectors (or blocks, or frames, etc.) having the same size as well (e.g., both sides employed 512 byte sectors in a HDD application).

Figure 8:
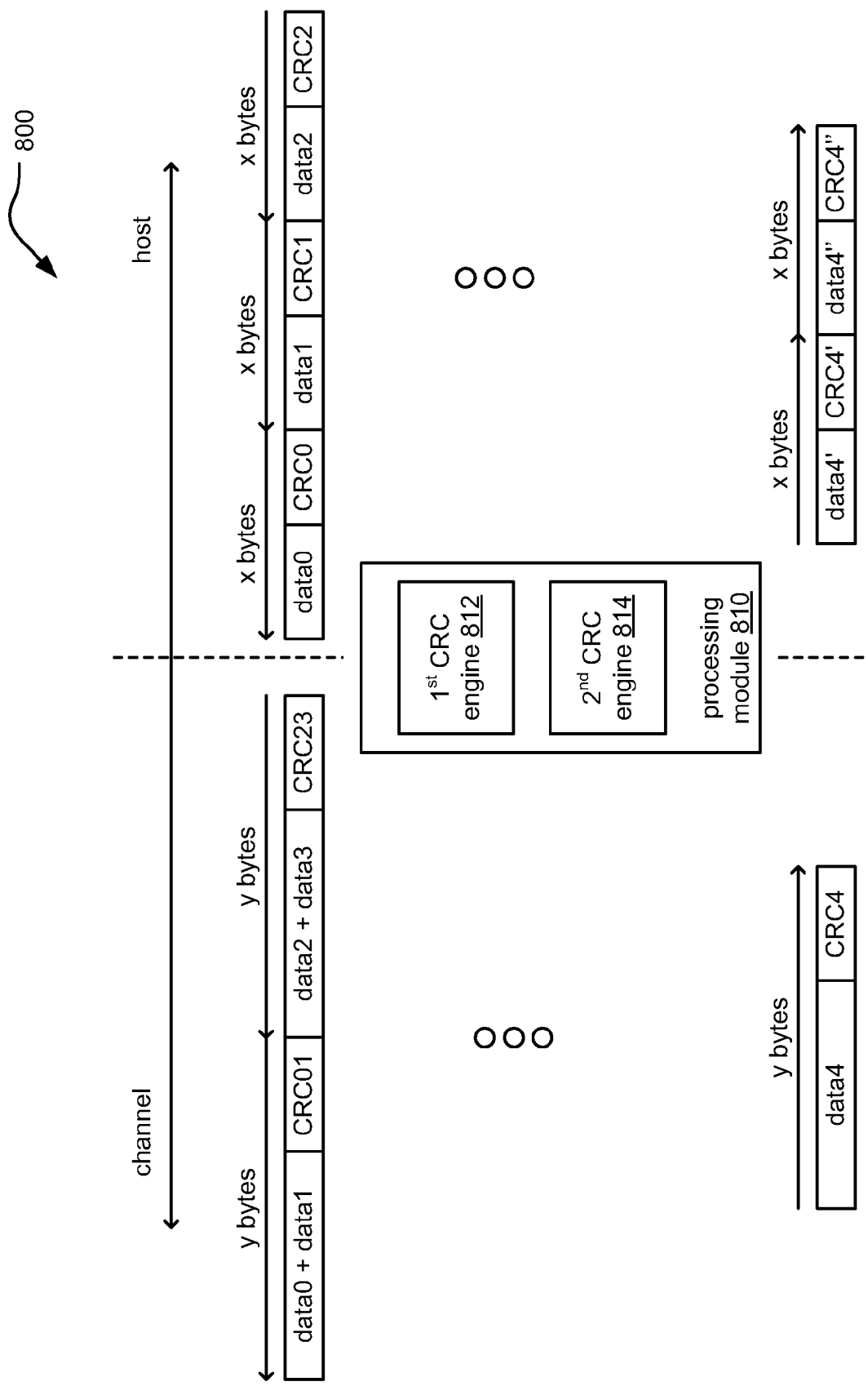
FIG. 8 illustrates an embodiment of different sector sizes being employed on a channel side and a host side within a system including a HDD.

FIG. 8 illustrates an embodiment 800 of different sector sizes being employed on a channel side and a host side within a system including a HDD. This embodiment 800 also employs the illustration between channel and host sides within a HDD. A processing module 810 (which itself can include an integrated memory or be coupled to a memory or be coupled to an external memory) is operable to perform the processing of a $1^{st}$ CRC engine 812 and a $2^{nd}$ CRC engine 814. The $1^{st}$ CRC engine 812 and the $2^{nd}$ CRC engine 814 can be separately implemented circuitry in some embodiments. The $1^{st}$ CRC engine 812 and the $2^{nd}$ CRC engine 814 can also be implemented within a single integrated circuit. Also, the $1^{st}$ CRC engine 812 and the $2^{nd}$ CRC engine 814 can be co-located relatively close to one another in desired embodiments.

In other embodiments, the operations of the $1^{st}$ CRC engine 812 and the $2^{nd}$ CRC engine 814 can be partitioned within firmware, software, or some other executable code that can be performed by a single processing module.

Information provided from the host side arrives in the form of data blocks such that each data block includes a data portion and a corresponding CRC field. In this embodiment, the size of the data blocks from the host side are each x bytes. It is noted that a first data block includes a data portion [data0] and a corresponding CRC field [CRC0]; the CRC field [CRC0] indicates the CRC of the data portion [data0]. A second data block includes a data portion [data1] and a corresponding CRC field [CRC1]; the CRC field [CRC1] indicates the CRC of the data portion [data1]. This continues on for all of the blocks provided from the host side.

The $1^{st}$ CRC engine 812 operates to process these data blocks provided from the host side thereby extracting each data portion from each data block and thereby generating a first plurality of data portions.

For example, when processing the first data block that includes the data portion [data0] and the corresponding CRC field [CRC0] and the second data block that includes the data portion [data1] and the corresponding CRC field [CRC1], the $1^{st}$ CRC engine 812 combines the data portion [data0] and the data portion [data1] to generate an aggregated data portion [data0+data1]. The $1^{st}$ CRC engine 812 then generates an aggregated CRC field [CRC01] corresponding to the aggregated data portion [data0+data1].

Considering another example, when processing the third data block that includes the data portion [data2] and the corresponding CRC field [CRC2] and the fourth data block that includes the data portion [data3] and the corresponding CRC field [CRC3], the $1^{st}$ CRC engine 812 combines the data portion [data2] and the data portion [data3] to generate an aggregated data portion [data2+data3]. The $1^{st}$ CRC engine 812 then generates an aggregated CRC field [CRC23] corresponding to the aggregated data portion [data2+data3].

This example shows the translation from data blocks (e.g., or sectors, or frames, etc.) having size of x bytes to data blocks (e.g., or sectors, or frames, etc.) having size of y bytes.

It is noted that the new aggregated CRC fields correspond to and are generated from the aggregated data portion; the aggregated CRC fields are not merely a combination of two or more CRC fields that correspond to two or more data portions from two or more data blocks. It is also noted that the $1^{st}$ CRC engine 812 can check each of the CRC0, CRC1, CRC2, etc. to verify the data within each of the data0, data1, data2, etc., respectively, before generating any aggregated data portion that includes those data portions. If needed, the $1^{st}$ CRC engine 812 can request a re-transmission of those data blocks when a corresponding CRC field therein indicates an error within the data portion of that data block. For example, if the $1^{st}$ CRC engine 812 detects an error when processing the CRC0, then the $1^{st}$ CRC engine 812 can request a re-transmission of the first data block that includes the data portion [data0] and the corresponding CRC field [CRC0].

The $1^{st}$ CRC engine 812 then is operable to combine an aggregated data portion and a corresponding aggregated CRC field thereby generating an aggregated data block. For example, the $1^{st}$ CRC engine 812 combines the first aggregated data portion [data0+data1] and the first aggregated CRC field [CRC01] to form a first aggregated data block, which can then be output from the processing module 810. This can then be transmitted to another location within the communication system (e.g., to the channel within a HDD context).

The $2^{nd}$ CRC engine 814 is implemented to receive aggregated data blocks from the channel side. Each of these aggregated data blocks from the channel side includes a corresponding aggregated data portion and a corresponding aggregated CRC field. The $2^{nd}$ CRC engine 814 is operable to extract the aggregated data portion from the second aggregated data block and also to partition the aggregated data portion into a plurality of data portions.

It is also noted that the $2^{nd}$ CRC engine 814 can check each the aggregated CRC field to verify the data within an aggregated data blocks from the channel side. If needed, the $2^{nd}$ CRC engine 814 can request a re-transmission of those aggregated data blocks when a corresponding CRC field therein indicates an error within the data portion of that data block. The $2^{nd}$ CRC engine 814 is operable to generate a CRC field corresponding to each data portion that has been partitioned from a received aggregated data portion of the received aggregated data block.

For example, if a received aggregated data block includes an aggregated data portion [data4] and an aggregated CRC field [CRC4], and if the aggregated data portion [data4] is partitioned into two data portions ([data4'] and [data4"]), then the $2^{nd}$ CRC engine 814 is operable to generate a corresponding CRC field for each of the two data portions ([data4'] and [data4"]), which can be depicted as ([CRC4'] and [CRC4"]), respectively.

Then, the $2^{nd}$ CRC engine 814 is operable to combine each of these generates CRC fields with its corresponding data portion. For example, the $2^{nd}$ CRC engine 814 is operable to combine data portion [data4'] with its corresponding CRC field [data4'], and the $2^{nd}$ CRC engine 814 is operable to combine data portion [data4"] with its corresponding CRC field [data4"] thereby generating two successive data blocks. These data blocks can then be output from the processing module 810 to the host side.

This embodiment of FIG. 8 shows that the sectors (or blocks, frames, etc.) on the host side include x bytes each, and the sectors (or blocks, frames, etc.) on the channel side include y bytes each. However, it is noted that any desired relationship between sizes of sectors (or blocks, frames, etc.) on each side can be processed in accordance with certain aspects of the invention. For example, the size of the sectors (or blocks, frames, etc.) on the channel side can be less than, greater then, or equal to the size of the sectors (or blocks, frames, etc.) on the host side. The processing and translation depicted herein can be equally applied to any of these contingencies.

Figure 9:
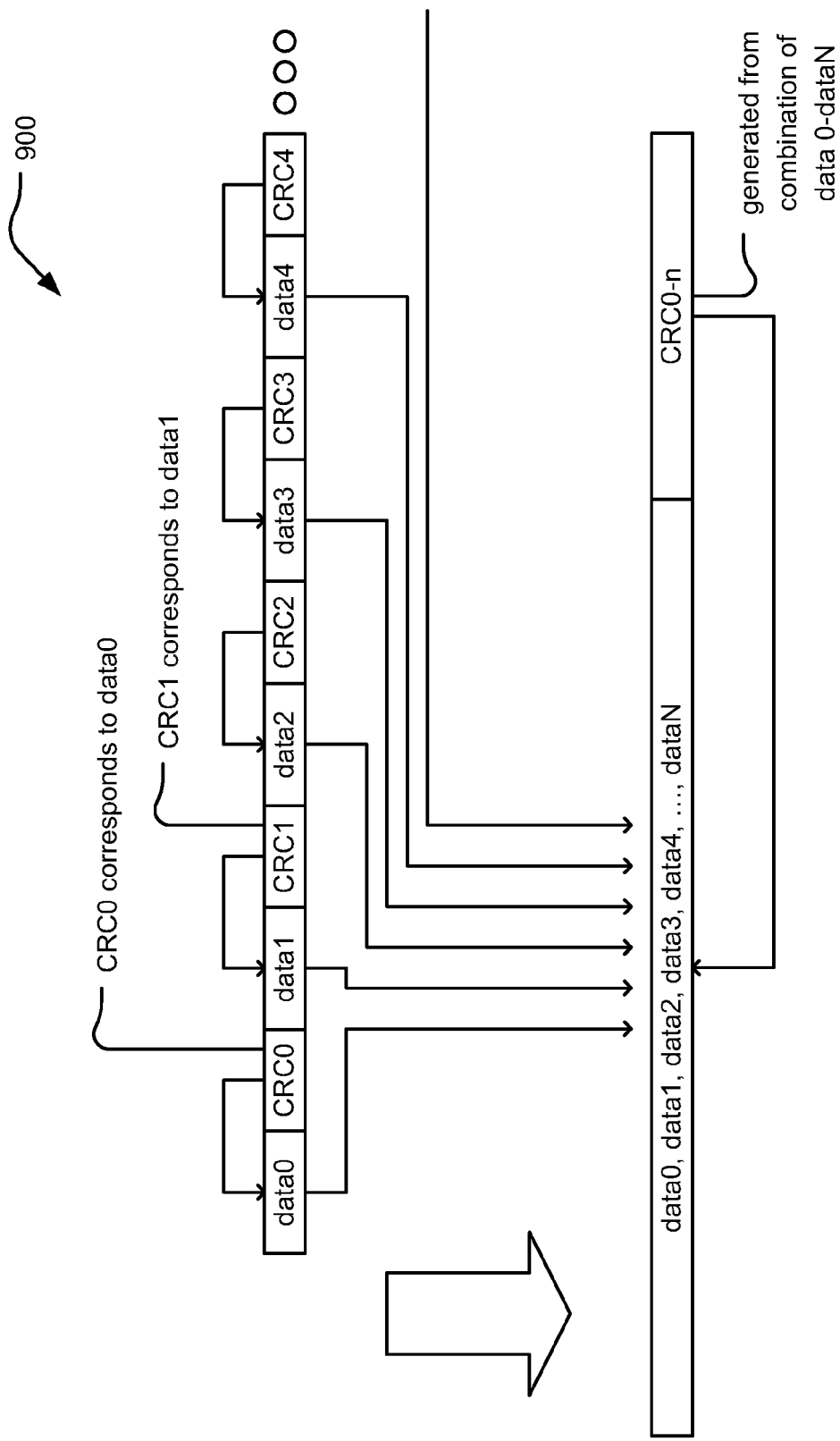
FIG. 9 illustrates an embodiment of processing data blocks (each including a corresponding CRC field) to generate an aggregated data block.

FIG. 9 illustrates an embodiment 900 of processing data blocks (each including a corresponding CRC field) to generate an aggregated data block. This diagram shows the generation of an aggregated data block having any desired size. A plurality of data blocks such that each data portion within each data block has a corresponding CRC field is received. The CRC field [CRC0] corresponds to the data portion [data0] within a first data block; the CRC field [CRC1] corresponds to the data portion [data1] within a second data block; and so on.

The data portions from each of the data blocks are extracted thereby forming an aggregated data portion. In this diagram, the data portions [data0, data1, data2, data3, data4 up to a data portion 'dataN'] are all combined to form an aggregated data portion. A new CRC field, and aggregated CRC field, is then generated using the verified data within the aggregated data portion. It is noted that each of the corresponding CRC fields (e.g., [CRC0], [CRC1], etc.) can be employed to verify the data portions ([data0], [data1], etc.) before forming the aggregated data portion. If needed, one, some or all of the data portions ([data0], [data1], etc.) may need to be re-received based on any error indicated by their corresponding CRC fields.

Figure 10:
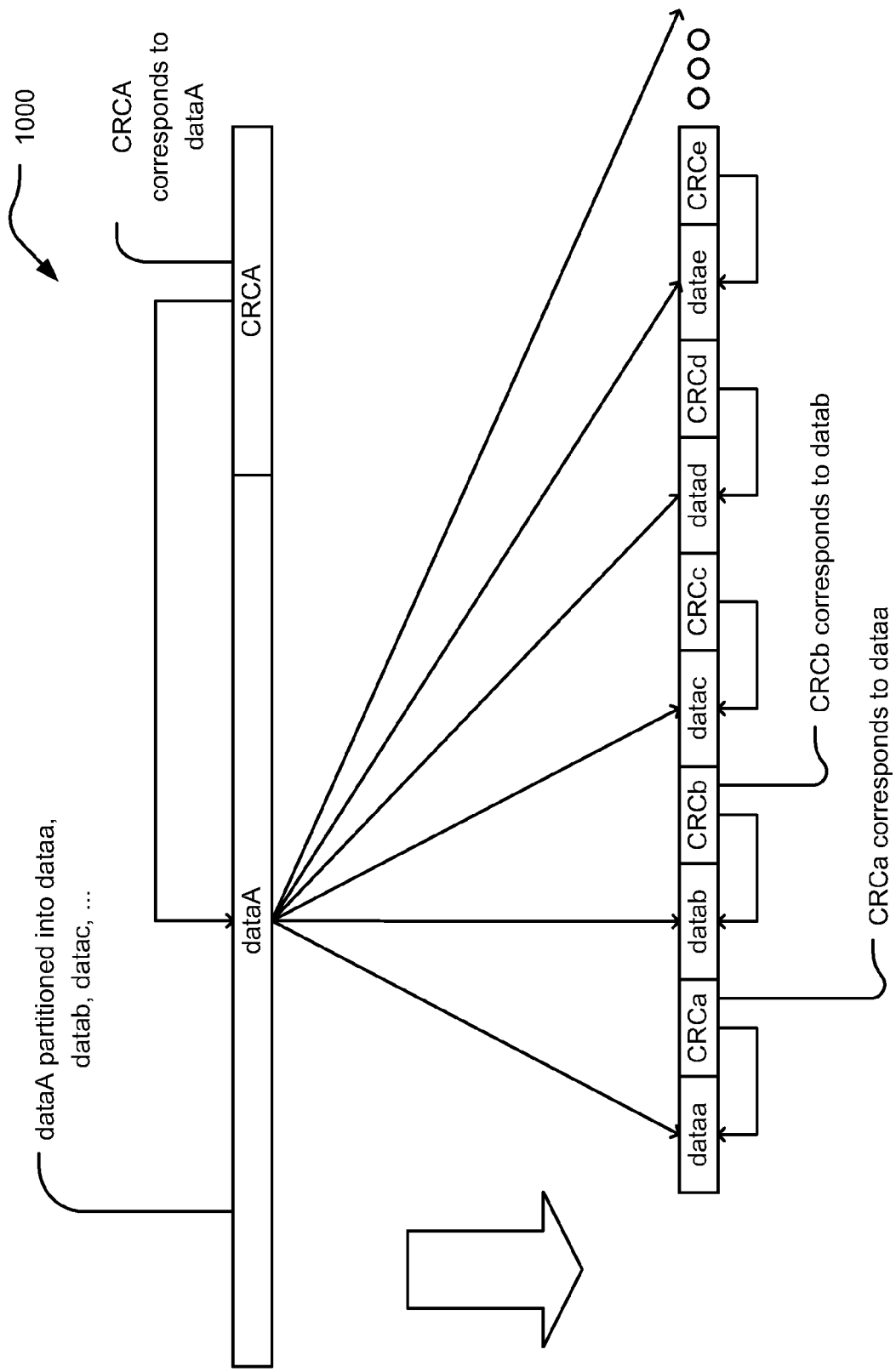
FIG. 10 illustrates an embodiment of processing a data block (that includes a corresponding CRC field) to generate a number of data portions and also generating a separate CRC field to correspond with each data portion.

FIG. 10 illustrates an embodiment 1000 of processing a data block (that includes a corresponding CRC field) to generate a number of data portions and also generating a separate CRC field to correspond with each data portion. This diagram shows the generation of a plurality of data blocks from a received aggregated data block (that includes an aggregated data portion [dataA] and a corresponding aggregated CRC field [CRCA]).

It is noted that the aggregated CRC field [CRCA] can be employed to verify the data within the aggregated data portion [dataA]; if any error is detected therein, the aggregated data portion [dataA] may need to be re-received.

The aggregated data portion [dataA] of the aggregated data block is partitioned into a plurality of data portions [dataa], [datab], etc. Each of the data portions [dataa], [datab], etc. can be processed to generate a corresponding CRC field. For example, data portion [dataa] is processed to generate CRC field [CRCa]; data portion [datab] is processed to generate CRC field [CRCb]; and so on.

Figure 11:
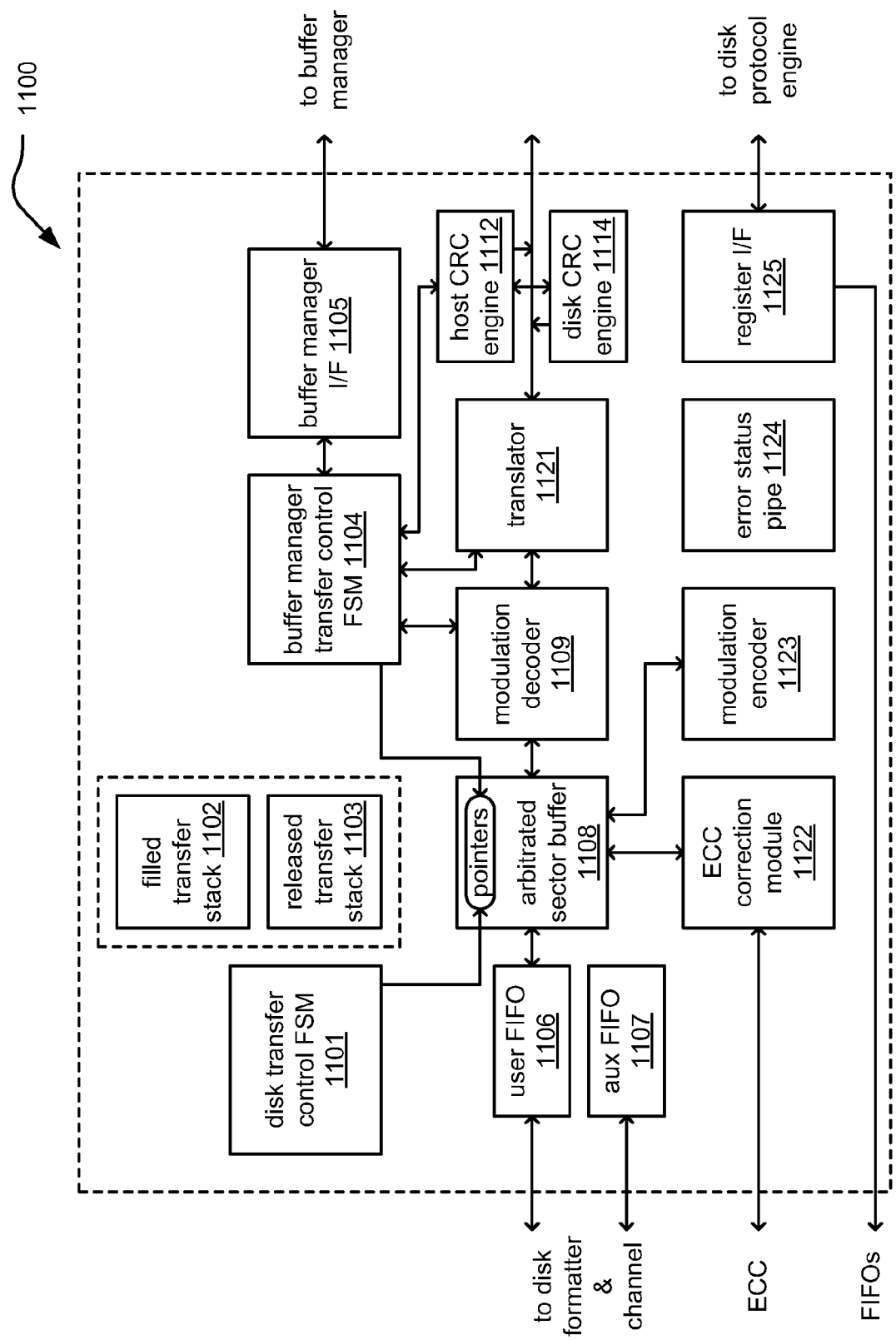
FIG. 11 illustrates an embodiment of a disk datapath module.

FIG. 11 illustrates an embodiment of a disk datapath module 1100. A number of different processing modules are included within the disk datapath module 1100. The disk datapath module 1100 coupled to a buffer manager on the host side, and to a disk formatter and subsequently to the channel on the channel side.

The CRC engines (e.g., host CRC engine 1112 and disk CRC engine 1114) are located at the buffer transfer control FSM (finite State Machine) 1104 and the buffer manager interface 1105 in the disk datapath module 1100.

This sub-module (that includes the host CRC engine 1112 and disk CRC engine 1114) is operable to generate a CRC from data transferred across the interface to/from the buffer manager. During disk writes, the buffer manager CRC is checked for validity and a disk CRC is generated and appended at the end of the user data.

During reads from the disk, the disk CRC is checked and the buffer manager CRC is generated and stored in the main buffer through the shared cache by the DPE (Disk Protocol Engine). This sub-module (that includes the host CRC engine 1112 and disk CRC engine 1114) is controlled by external state machines and static control register bits. This diagram shows the relative location of the host CRC engine 1112 and the disk CRC engine 1114 in this embodiment.

It is also noted that the disk datapath module 1100 includes a translator 1121, a modulation encoder 1123 and a modulation decoder 1109, an error status pipe 1124, a register interface 1125 (which coupled to the DPE (Disk Protocol Engine)), an arbitrated sector buffer [whose pointers are governed by a disk transfer control FSM 1101 and the buffer transfer control FSM 1104], a filled buffer stack 1102 and a released buffer stack 1103, an error correction code (ECC) correction module 1122, a user FIFO buffer 1106, and an auxiliary FIFO buffer 1107.

In some embodiments, an aggregated data block undergoes modulation encoding (e.g., in the modulation encoder 1123) before being written to media of the hard disk drive (HDD). Also, aggregated data blocks read from the media of the HDD can undergo modulation decoding (e.g., in the modulation decoder 1109) before being transferred out to the host side.

It is noted that the host CRC engine 1112 and disk CRC engine 1114 can be implemented within a single integrated circuit. In addition, the disk datapath module 1100 can itself be implemented within a single integrated circuit. Alternatively, multiple integrated circuits can be employed to implement each of the various modules depicted within the disk datapath module 1100.

Figure 12:
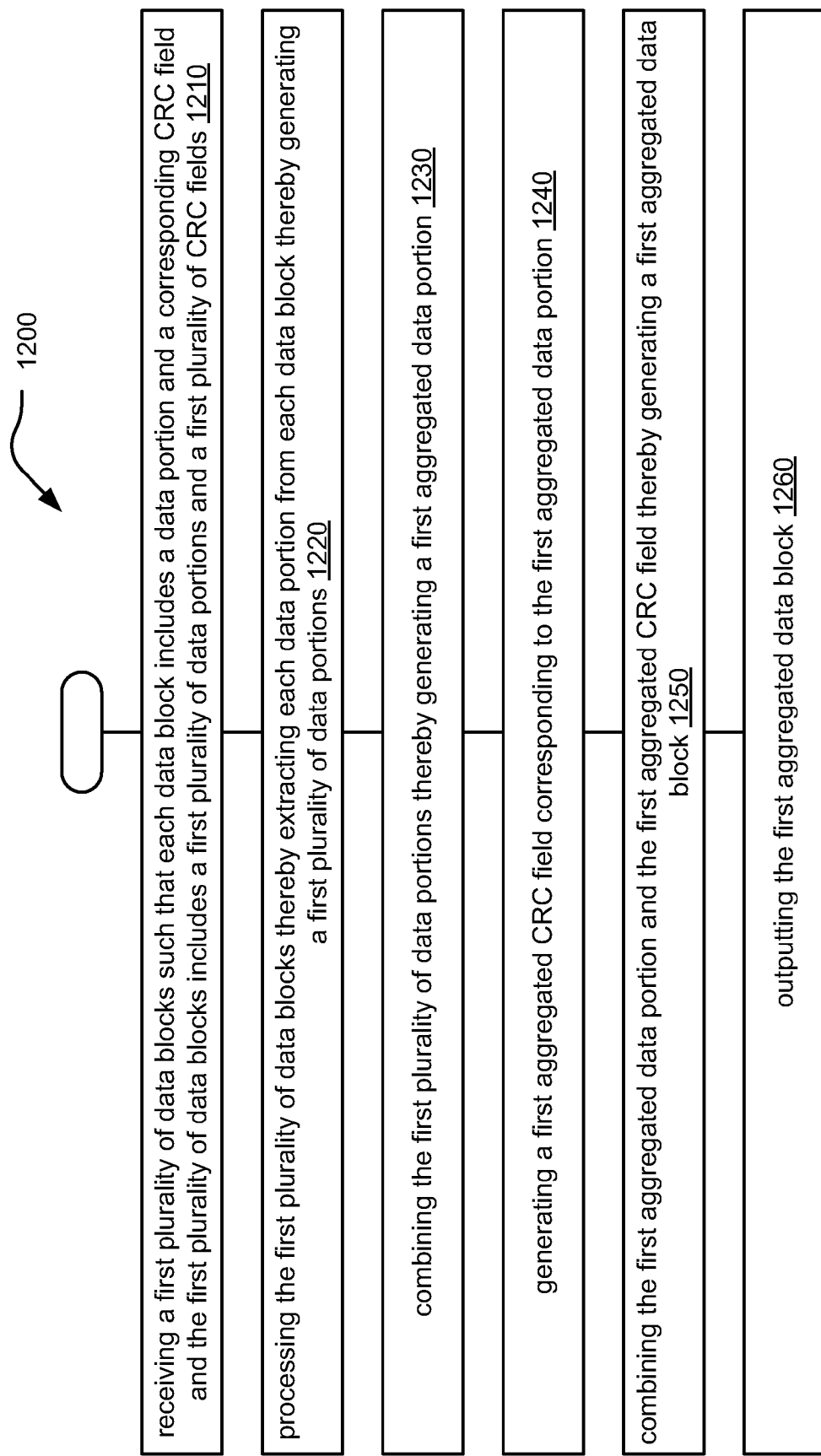
FIG. 12 and FIG. 13 illustrate embodiments of methods for checking and/or appending cyclic redundancy check (CRC) fields during data transfers within a hard disk drive (HDD).
Figure 13:
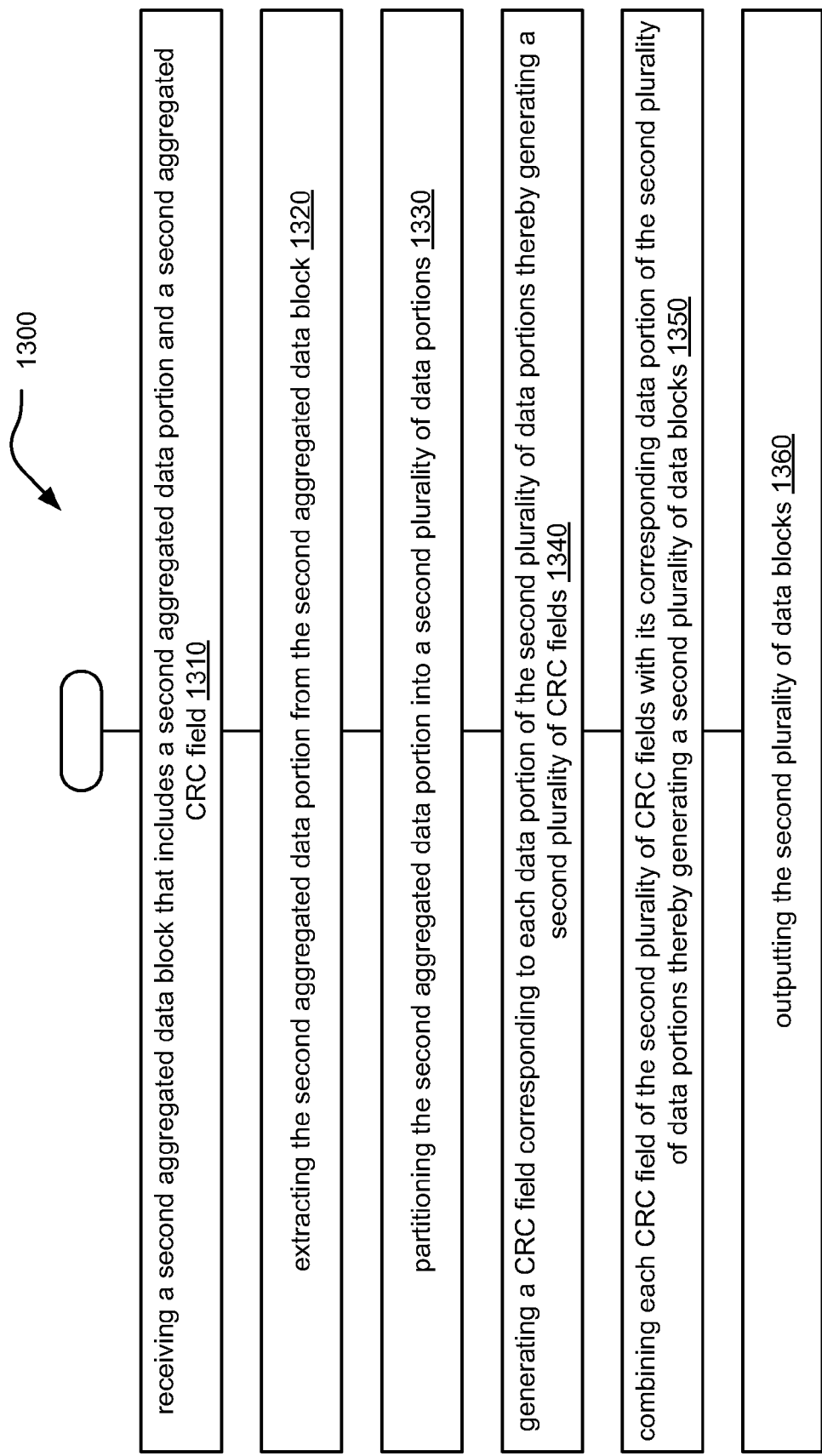

FIG. 12 and FIG. 13 illustrate embodiments of method for checking and/or appending cyclic redundancy check (CRC) fields during data transfers within a hard disk drive (HDD).

Referring to the method 1200, the method 1200 begins by receiving a first plurality of data blocks such that each data block includes a data portion and a corresponding CRC field and the first plurality of data blocks includes a first plurality of data portions and a first plurality of CRC fields, as shown in a block 1210.

The method 1200 continues by processing the first plurality of data blocks thereby extracting each data portion from each data block thereby generating a first plurality of data portions, as shown in a block 1220. The method 1200 continues by combining the first plurality of data portions thereby generating a first aggregated data portion, as shown in a block 1230. The method 1200 continues by generating a first aggregated CRC field corresponding to the first aggregated data portion, as shown in a block 1240.

The method 1200 continues by combining the first aggregated data portion and the first aggregated CRC field thereby generating a first aggregated data block, as shown in a block 1250. The method 1200 continues by outputting the first aggregated data block, as shown in a block 1260.

Referring to the method 1300, the method 1300 begins by receiving a second aggregated data block that includes a second aggregated data portion and a second aggregated CRC field, as shown in a block 1310.

The method 1300 continues by extracting the second aggregated data portion from the second aggregated data block, as shown in a block 1310. The method 1300 continues by partitioning the second aggregated data portion into a second plurality of data portions, as shown in a block 1320. The method 1300 continues by generating a CRC field corresponding to each data portion of the second plurality of data portions thereby generating a second plurality of CRC fields, as shown in a block 1340.

The method 1300 continues by combining each CRC field of the second plurality of CRC fields with its corresponding data portion of the second plurality of data portions thereby generating a second plurality of data blocks, as shown in a block 1350. The method 1300 continues by outputting the second plurality of data blocks, as shown in a block 1360.

It is noted that the method 1200 and the method 1300 can be performed within a combined method embodiment that performs both of the method 1200 and the method 1300.

It is noted that the various modules (e.g., encoding modules, decoding modules, CRC engines, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A disk datapath processing module, the module comprising:
   a first cyclic redundancy check (CRC) engine that is implemented to:
     receive a first plurality of data blocks such that each data block includes a data portion and a corresponding CRC field and the first plurality of data blocks includes a first plurality of data portions and a first plurality of CRC fields;
     process the first plurality of data blocks thereby extracting each data portion from each data block thereby generating a first plurality of data portions;
     combine the first plurality of data portions thereby generating a first aggregated data portion;
     generate a first aggregated CRC field corresponding to the first aggregated data portion;
     combine the first aggregated data portion and the first aggregated CRC field thereby generating a first aggregated data block; and
     output the first aggregated data block; and
   a second CRC engine that is implemented to:
     receive a second aggregated data block that includes a second aggregated data portion and a second aggregated CRC field;
     extract the second aggregated data portion from the second aggregated data block;
     partition the second aggregated data portion into a second plurality of data portions;
     generate a CRC field corresponding to each data portion of the second plurality of data portions thereby generating a second plurality of CRC fields;
     combine each CRC field of the second plurality of CRC fields with its corresponding data portion of the second plurality of data portions thereby generating a second plurality of data blocks; and
     output the second plurality of data blocks.

2. The module of claim 1, wherein:
   the first aggregated data block is written to media of a hard disk drive (HDD); and
   the second aggregated data block is read from the media of the HDD.

3. The module of claim 1, wherein:
   the first aggregated data block undergoes modulation encoding before being written to media of a hard disk drive (HDD); and the second aggregated data block undergoes modulation decoding after being read from the media of the HDD.

4. The module of claim 1, wherein:
the first plurality of blocks is read from media of a hard disk drive (HDD); and
the second plurality of blocks is written to the media of the HDD.

5. The module of claim 1, wherein:
the first plurality of blocks undergoes modulation decoding after being read from media of a hard disk drive (HDD); and
the second plurality of blocks undergoes modulation encoding before being written to the media of the HDD.

6. The module of claim 1, wherein:
the first CRC engine processes each CRC field of the first plurality of CRC fields to determine whether any data portion of the first plurality of data portions includes an error.

7. The module of claim 1, wherein:
the first CRC engine processes each CRC field of the first plurality of CRC fields to determine whether any data portion of the first plurality of data portions includes an error; and
if the first CRC engine identifies the error, the first CRC engine requests a retransmission of the first plurality of data blocks from at least one additional module that provides the first plurality of data blocks to the first CRC engine.

8. The module of claim 1, wherein:
the second CRC engine processes the second aggregated CRC field to determine whether the second aggregated data portion includes an error.

9. The module of claim 1, wherein:
the second CRC engine processes the second aggregated CRC field to determine whether the second aggregated data portion includes an error; and
if the second CRC engine identifies the error, the second CRC engine requests a retransmission of the second aggregated data block from at least one additional module that provides second aggregated data block to the second CRC engine.

10. The module of claim 1, wherein:
at least one of the first aggregated data block and the second first aggregated data block has a first byte size format; and
each block within at least one of the first plurality of data blocks and the second plurality of data blocks has a second byte size format.

11. The module of claim 1, wherein:
the first CRC engine and the second CRC engine are implemented within an integrated circuit.

12. A disk datapath processing module, the module comprising:
a first cyclic redundancy check (CRC) engine that is implemented to:
receive a first plurality of data blocks such that each data block includes a data portion and a corresponding CRC field and the first plurality of data blocks includes a first plurality of data portions and a first plurality of CRC fields;
process the first plurality of CRC fields to determine whether any data portion of the first plurality of data portions includes a first error and request a retransmission of the first plurality of data blocks thereto when the first error is detected;
process the first plurality of data blocks thereby extracting each data portion from each data block thereby generating a first plurality of data portions;
combine the first plurality of data portions thereby generating a first aggregated data portion;
generate a first aggregated CRC field corresponding to the first aggregated data portion;
combine the first aggregated data portion and the first aggregated CRC field thereby generating a first aggregated data block; and
output the first aggregated data block; and
a second CRC engine that is implemented to:
receive a second aggregated data block that includes a second aggregated data portion and a second aggregated CRC field;
process the second aggregated CRC field to determine whether the second aggregated data portion includes a second error and request a retransmission of the second aggregated data block thereto when the first error is detected;
extract the second aggregated data portion from the second aggregated data block;
partition the second aggregated data portion into a second plurality of data portions;
generate a CRC field corresponding to each data portion of the second plurality of data portions thereby generating a second plurality of CRC fields;
combine each CRC field of the second plurality of CRC fields with its corresponding data portion of the second plurality of data portions thereby generating a second plurality of data blocks; and
output the second plurality of data blocks.

13. The module of claim 12, wherein:
the first aggregated data block is written to media of a hard disk drive (HDD); and
the second aggregated data block is read from the media of the HDD.

14. The module of claim 12, wherein:
the first plurality of blocks is read from media of a hard disk drive (HDD); and
the second plurality of blocks is written to the media of the HDD.

15. The module of claim 12, wherein:
at least one of the first aggregated data block and the second first aggregated data block has a first byte size format; and
each block within at least one of the first plurality of data blocks and the second plurality of data blocks has a second byte size format.

16. The module of claim 12, wherein:
the first CRC engine and the second CRC engine are implemented within an integrated circuit.

17. A method for checking and appending cyclic redundancy check (CRC) fields during data transfers within a hard disk drive (HDD), the method comprising:
receiving a first plurality of data blocks such that each data block includes a data portion and a corresponding CRC field and the first plurality of data blocks includes a first plurality of data portions and a first plurality of CRC fields;
processing the first plurality of data blocks thereby extracting each data portion from each data block thereby generating a first plurality of data portions;
combining the first plurality of data portions thereby generating a first aggregated data portion;
generating a first aggregated CRC field corresponding to the first aggregated data portion;

combining the first aggregated data portion and the first aggregated CRC field thereby generating a first aggregated data block;
outputting the first aggregated data block;
receiving a second aggregated data block that includes a second aggregated data portion and a second aggregated CRC field;
extracting the second aggregated data portion from the second aggregated data block;
partitioning the second aggregated data portion into a second plurality of data portions;
generating a CRC field corresponding to each data portion of the second plurality of data portions thereby generating a second plurality of CRC fields;
combining each CRC field of the second plurality of CRC fields with its corresponding data portion of the second plurality of data portions thereby generating a second plurality of data blocks; and
outputting the second plurality of data blocks.

18. The method of claim 17, further comprising:
processing each CRC field of the first plurality of CRC fields to determine whether any data portion of the first plurality of data portions includes a first error; and
processing the second aggregated CRC field to determine whether the second aggregated data portion includes an error.

19. The method of claim 17, wherein:
at least one of the first aggregated data block and the second first aggregated data block has a first byte size format; and
each block within at least one of the first plurality of data blocks and the second plurality of data blocks has a second byte size format.

20. The method of claim 17, wherein:
the method is performed within a disk datapath processing module that is implemented within the HDD.

\* \* \* \* \*

UNITED STATES PATENT AND TRADEMARK OFFICE
CERTIFICATE OF CORRECTION

PATENT NO.         : 8,074,146 B2
APPLICATION NO.    : 11/972670
DATED              : December 6, 2011
INVENTOR(S)        : John P. Mead It is certified that error appears in the above-identified patent and that said Letters Patent is hereby corrected as shown below:

Col. 15, lines 45-46, in claim 10: replace "and the second first" with "and the second"
Col. 16, lines 44-45, in claim 15: replace "and the second first" with "and the second"

Signed and Sealed this
Twelfth Day of February, 2013

Teresa Stanek Rea
*Acting Director of the United States Patent and Trademark Office*